(12) United States Patent
Moore et al.

(10) Patent No.: US 10,062,450 B1
(45) Date of Patent: Aug. 28, 2018

(54) PASSIVE SWITCHED CAPACITOR CIRCUIT FOR SAMPLING AND AMPLIFICATION

(71) Applicant: Analog Devices, Inc., Norwood, MA (US)

(72) Inventors: Ralph D. Moore, Greensboro, NC (US); Scott G. Bardsley, High Point, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/629,057

(22) Filed: Jun. 21, 2017

(51) Int. Cl.
  *H03M 1/12* (2006.01)
  *G11C 27/02* (2006.01)
  *H03H 19/00* (2006.01)

(52) U.S. Cl.
  CPC ........ *G11C 27/026* (2013.01); *H03H 19/004* (2013.01); *H03M 1/1245* (2013.01)

(58) Field of Classification Search
  CPC .. H03M 1/1245; H03H 19/004; G11C 27/026
  USPC ........................................................ 341/172
  See application file for complete search history.

(56) References Cited

U.S. PATENT DOCUMENTS

| | | | | |
|---|---|---|---|---|
| 5,453,710 A | * | 9/1995 | Gilbert | H03H 11/26 327/277 |
| 6,391,667 B1 | * | 5/2002 | Hashimoto | H02M 3/07 327/379 |
| 6,473,021 B1 | * | 10/2002 | Somayajula | H03M 1/68 341/155 |
| 6,924,760 B1 | * | 8/2005 | McLeod | H03M 1/066 341/144 |
| 8,284,098 B2 | * | 10/2012 | Sahinoglu | G01S 13/5244 342/189 |
| 2005/0285683 A1 | * | 12/2005 | Drost | H03F 3/08 330/302 |
| 2011/0248875 A1 | | 10/2011 | Holcombe | |

(Continued)

OTHER PUBLICATIONS

HamidReza Mafi et al., *Performance Enhancement of a 10-Bit 50-MS/s Open Loop Pipelined ADC Using a Novel Digital Calibration*, 20th Iranian Conference on Electrical Engineering (ICEE2012), May 15-17, 2012, Tehran, Iran, 5 pages.

(Continued)

*Primary Examiner* — Lam T Mai
(74) *Attorney, Agent, or Firm* — Patent Capital Group

(57) ABSTRACT

In pipelined analog-to-digital converters (ADCs), a passive switched capacitor (PSWC) circuit can be used in a multiplying analog-to-digital converter (MDAC), which generates an analog output being fed to a subsequent stage. Complementary analog input signals are sampled respectively onto first and second capacitors, which are stacked to provide gain. The first capacitor is positioned between a first input switch and an output node of the PSWC circuit, and the second capacitor is positioned between the second input switch and a digital-to-analog converter (DAC) output. The topology advantageously isolates common modes of the complementary analog input signals, the DAC output, and the output of the PSWC circuit. As a result, the topology offers more degrees of freedom in the overall circuit design when stages having the MDAC are cascaded, resulting in pipelined ADCs with a more elegant design with lower noise and lower power consumption.

20 Claims, 8 Drawing Sheets

(56) References Cited

U.S. PATENT DOCUMENTS

2011/0310051 A1* 12/2011 Souchkov ............. G06F 3/0416
 345/174
2014/0070976 A1 3/2014 Hurrell et al.
2014/0203958 A1 7/2014 Okuda et al.

OTHER PUBLICATIONS

Timothy A. Monk et al., *Iterative Gain Enhancement in an Algorithmic ADC*, IEEE Transactions on Circuits and Systems—I: Regular Papers, vol. 63, No. 4, Apr. 2016, 11 pages.
Jae-Won Nam et al., *An Embedded Passive Gain Technique for Asynchronous SAR ADC Achieving 10.2 ENOB 1.36-mW at 95-MS/s in 65 nm CMOS*, IEEE Transactions on Circuits and Systems—I: Regular Papers, vol. 63, No. 10, Oct. 2016, 11 pages.
Kairang Chen, *Design of a Gain-stage for Pipelined SAR ADC Using Capacitive Charge Pump*, MIXDES 2016, 23$^{rd}$ International Conference "Mixed Design of Integrated Circuits and Systems", Jun. 23-25, 2016, Lodz, Poland, 4 pages.
Zhijie Chen et al., *A 2$^{nd}$ Order Fully-Passive Noise-Shaping SAR ADC with Embedded Passive Gain*, IEEE Asian Solid-State Circuits Conference, Nov. 7-9, 2016, Toyama, Japan, 4 pages.
Kairang Chen et al., *A Pipelined SAR ADC with Gain-Stage Based on Capacitive Charge Pump*, Analog Integr Circ Sig Process (2017) 90:43-53, 11 pages.
Imran Ahmed, *Pipelined ADC Enhancement Techniques*, A Thesis, University of Toronto, © 2008, 202 pages.
Imran Ahmed et al., *A Low-Power Capacitive Charge Pump Based Pipelined ADC*, IEEE Journal of Solid-State Circuits, vol. 45, No. 5, May 2010, 12 pages.
Lane Brooks et al., *A 12b, 50 MS/s, Fully Differential Zero-Crossing Based Pipelined ADC*, IEEE Journal of Solid-State Circuits, vol. 44, No. 12, Dec. 2009, 16 pages.
Mahdi Hosseinnejad et al., *Fully Differential Charge-Pump Comparator-Based Pipelined ADC in 90 nm CMOS*, Microelectronics Journal 53 (2016) 8-15, 9 pages.
Imran Ahmed, *Pipelined ADC Design Tutorial*, Imran Ahmed's Website, © 2008, 14 pages.

* cited by examiner

US 10,062,450 B1

PASSIVE SWITCHED CAPACITOR CIRCUIT FOR SAMPLING AND AMPLIFICATION

TECHNICAL FIELD OF THE DISCLOSURE

The present disclosure relates to the field of integrated circuits, in particular to charge pump amplifiers.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense. As the applications needing ADCs grow, the need for accurate and reliable conversion performance also grows.

OVERVIEW

In pipelined ADCs, a passive switched capacitor (PSWC) circuit can be used in a multiplying digital-to-analog converter (MDAC), which generates an analog output being fed to a subsequent stage. Complementary analog input signals are sampled respectively onto first and second capacitors, which are stacked to provide gain. The first capacitor is positioned between a first input switch and an output node of the PSWC circuit, and the second capacitor is positioned between the second input switch and a digital-to-analog converter (DAC) output. The topology advantageously isolates common modes of the complementary analog input signals, the DAC output, and the output of the PSWC circuit. As a result, the topology offers more degrees of freedom in the overall circuit design when stages having the MDAC are cascaded, resulting in pipelined ADCs with a more elegant design with lower noise and lower power consumption.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Pipelined ADCs

One exemplary type of ADCs is the pipelined ADC, which is typically categorized as a high speed ADC (e.g., with sample rates above 5 million samples per second (MSPS) or even above 10 MSPS). Pipelined ADCs are used often with video, sampling radio applications, instrumentation (digital oscilloscopes, digital spectrum analyzers), etc.

A pipelined ADC comprises a plurality of stages, where the stages are cascaded. Different designs may vary design parameters such as the number of stages, the number of bits per stage, and timing. A first stage digitizes an analog input to the pipelined ADC, and a following stage digitizes an amplified residue from the first stage. The amplified residue is an amplified version of a difference between the analog input and a reconstructed analog input which was generated based on a digital output of the first stage. The pipelined ADC can include further stages for digitizing further residues. Digital outputs from the cascaded stages are combined to generate a final digital output, which has a number of bits representing the original analog input of the pipelined ADC. The term "pipelined" refers to the ability of one stage to process data from the previous stage during any given clock cycle. At the end of each phase of a particular clock cycle, the output of a given stage is passed on to the next stage and new data is shifted into the stage.

The MDAC in a Stage of the Pipelined ADC

Figure 1:
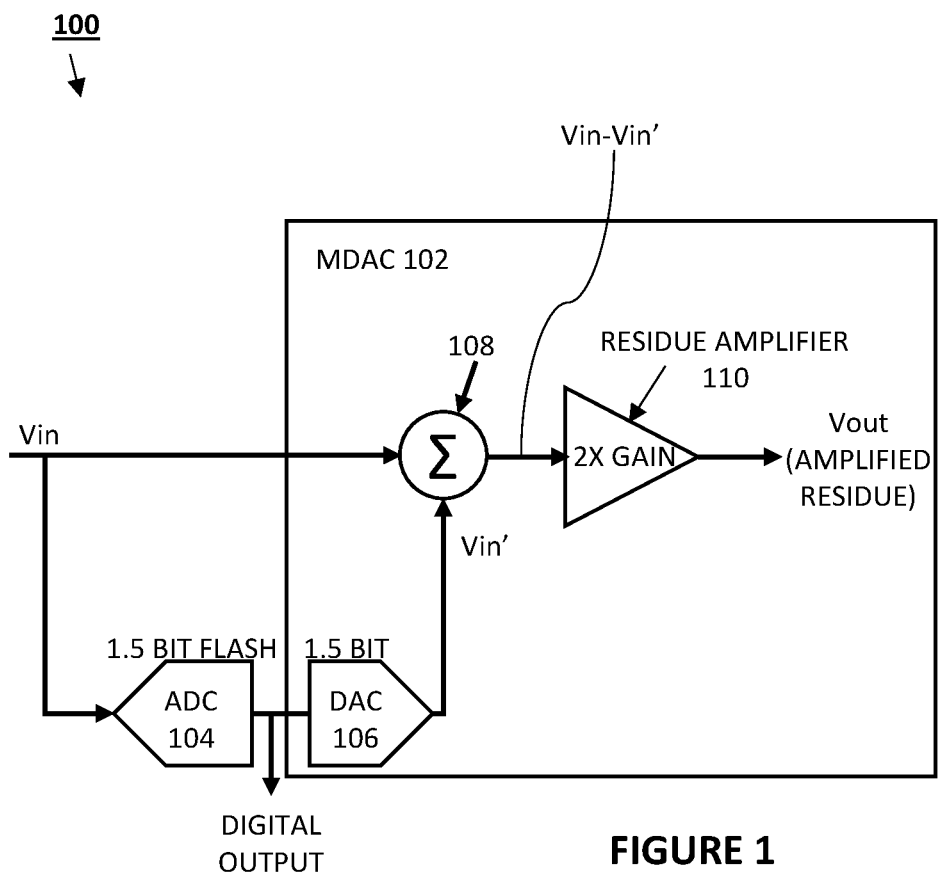
FIG. 1 shows an exemplary stage of a pipelined ADC, according to some embodiments of the disclosure.

FIG. 1 shows an exemplary stage of a pipelined ADC, according to some embodiments of the disclosure. In stage 100, the analog input Vin is digitized by ADC 104, which can be a coarse ADC for coarsely digitizing the analog input Vin. In one example, the ADC 104 is a 1.5 bit ADC, which can generate three possible digital outputs or levels. The digital output of the stage is then fed to a DAC 106 to generate the reconstructed analog input Vin'. A summation node or subtraction node 108 can be used to determine the difference between the analog input Vin and the reconstructed analog input Vin' (i.e., Vin−Vin'). The difference is then amplified by residue amplifier 110, which may provide a two (2) times gain, to generate the amplified residue Vout. The amplified residue Vout is provided to a following stage for further digitization. In other words, the following stage receives the amplified residue Vout as the analog input and generates a further digital output signal. If more stages are provided the following stage can generate a further amplified residue for the subsequent stage(s).

For a stage in a pipelined ADC, a multiplying DAC (MDAC) 102 provides the appropriate amount of (inter-stage) gain as well as the subtraction function. The function of the MDAC may be implemented with charge pump (CP) gain rather than the traditional charge amplifier. The feature of CP gain is implemented with a PSWC circuit followed by a buffer to drive the next stage. In contrast to the traditional charge amplifier, CP gain has no feedback involved (akin to an open loop design). As a result, MDAC implemented with CP gain can provide a greatly simplified architecture with significantly lower noise. Gain is not precisely controlled by a ratio of input and feedback capacitors (as in the traditional charge amplifier), rather it is dominantly set by the ratio of input capacitance to various parasitic capacitances. Digital post processing can used to compensate for actual gain relative to ideal stage gain.

The PSWC circuit achieves gain by sampling an input voltage onto multiple capacitors, and putting the capacitors in series to add up the voltages sampled on the multiple capacitors. Applying an appropriate voltage based on the DAC output to the capacitors during sampling, subtraction can also be achieved. The primary benefit of the PSWC gain topology is the ability to lower thermal noise which allows significantly smaller full scale signals for the same signal to noise ratio. Reduced full scale signals can make achieving good distortion performance possible. However, implementing the PSWC circuits with good performance is not trivial, and various circuit designs have a number of issues, especially when the passive switched capacitor circuit is being cascaded in stages of a high speed pipelined ADC. Moreover, implementing PSWC circuits in smaller process nodes (e.g., 28 nm or smaller) could be additionally more challenging.

When stages are cascaded, the output of the MDAC is fed as input to another MDAC in a following stage. One practical issue with PSWC circuit designs when stages are cascaded is that the output common mode of the PSWC circuit is not compatible with the input common mode of the PSWC circuit. As a result, a level shifter or a complex buffer may be required to cascade MDAC circuits. Adding a level shifter not only adds complexity to the circuit design, a level shifter can undesirably attenuate the signal (less amplification) and add noise to the system. Another practical issue with PSWC circuit designs used in a pipeline stage is that the input common mode may be required to match the DAC output common mode. This requirement can complicate the overall circuit design.

Improved PSWC Circuit

The remainder of this disclosure describes a PSWC circuit with CP gain that can address one or more of these concerns. Additionally, the PSWC circuit can have reduced noise, area, power, and better compatibility in a cascade signal chain when compared with other designs. The PSWC circuit is particularly beneficial when used in MDACs of cascaded stages of a pipelined ADC. During a sampling phase, charge is trapped on multiple capacitors using bottom plate sampling. During a charge transfer phase, capacitors are stacked in series to sum the trapped charges. The result can be buffered by an output buffer and applied to a following stage in a pipelined ADC. The PSWC circuit has a topology which decouples common modes, so that the PSWC circuit can be implemented with fewer devices than other PSWC topologies (since a level shifter or a complex output buffer can be avoided). The PSWC can be implemented with lower noise and higher gain with reduced complexity. The disclosed architecture is extendable to greater than having two times (2×) gain. For simplicity, a 2× gain configuration is demonstrated.

Figure 2:
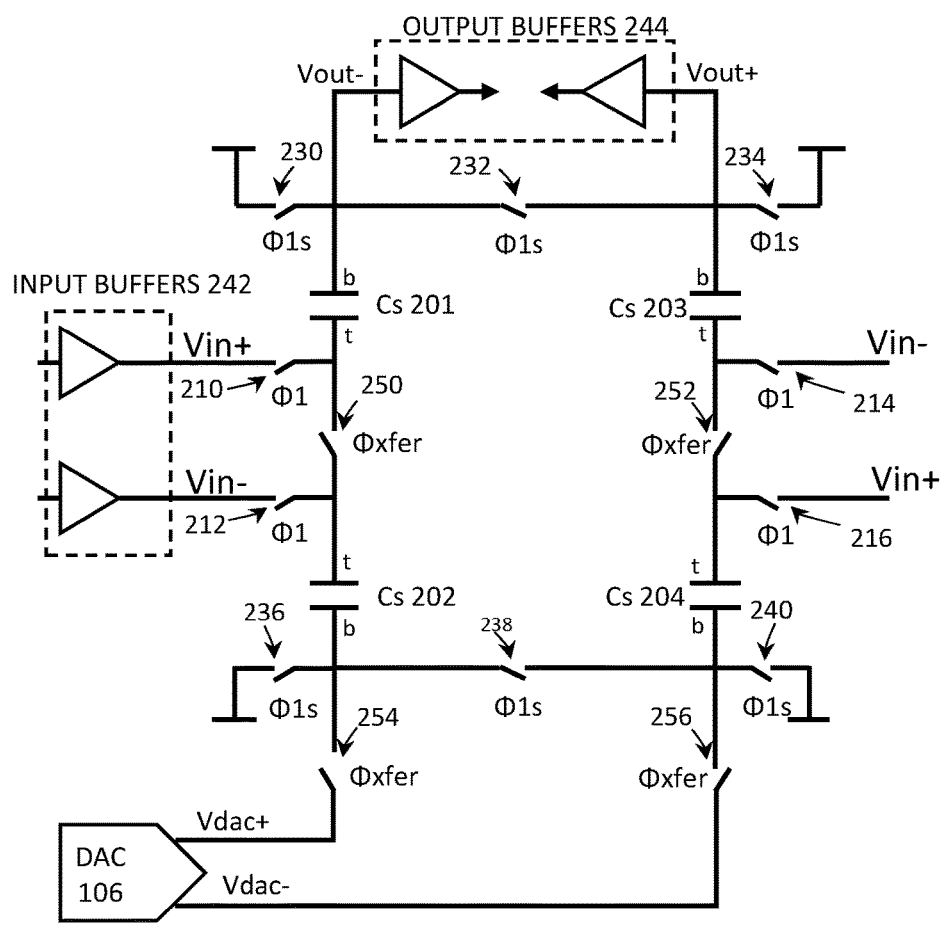
FIG. 2 shows an exemplary PSWC circuit used in an MDAC, according to some embodiments of the disclosure.

FIG. 2 shows an exemplary PSWC circuit used in an MDAC, according to some embodiments of the disclosure. The PSWC circuit implements charge pump gain with switches and capacitors in a unique topology. The capacitors are provided to trap or capture charge, and switches facilitate sampling, tracking and/or transferring of charge in the PSWC circuit.

For purposes of discussion, switches are used to describe devices that can be in an "open" state, or in a "closed" state. The devices can be implemented using transistors, where an "open" state of a switch corresponds to an "off" transistor and a "closed" state of a switch corresponds to an "on" transistor. A transistor can have a control terminal for receiving a control signal that can open the switch (transistor is off or not conducting current between two signal terminals) or close the switch (transistor is on and conducting current between two signal terminals). A logical "high" for a control signal can close the switch (transistor is on). A logical "low" for a control signal can open the switch (transistor is off). Phase symbols next to the switches in various FIGURES serve to illustrate the timing of the control signals for controlling the state of the switches.

The PSWC circuit seen in FIG. 2 includes first capacitor Cs 201, second capacitor Cs 202, third capacitor Cs 203 and fourth capacitor Cs 204. The PSWC circuit can include first input switch 210, second input switch 212, third input switch 214, and fourth input switch 216. The PSWC circuit can include first transfer switch 254, second transfer switch 250, third transfer switch 256, and fourth transfer switch 252. The PSWC circuit can include first bottom plate sampling switches 230, 232, and 234, and second bottom plate sampling switches 236, 238, and 240. The position of these devices in the PSWC circuit yields many practical benefits. The following passages describes these devices in greater detail.

First capacitor Cs 201 is between first input switch 210 for coupling a first one of complementary analog input signals (Vin+) to the first capacitor Cs 201 and a first one of complementary output nodes of the PSWC circuit (Vout−). In other words, Vin+ is on one side/plate of first capacitor Cs 201, Vout− is on the other side/plate of first capacitor Cs 201. Second capacitor Cs 202 is between second input switch 212 for coupling a second one of the complementary analog input signals (Vin−) to the second capacitor Cs 202 and first transfer switch 254 for coupling the second capacitor Cs 202 to a first one of complementary outputs of a DAC (Vdac+). In other words, Vin+ is on one side/plate of second capacitor Cs 202, Vdac+ is on the other side/plate of second capacitor Cs 202. Second transfer switch 250 is between first capacitor Cs 201 and second capacitor Cs 202, and closing the second transfer switch 250 can sum charges captured or sampled on the first capacitor Cs 201 and second capacitor Cs 202. The second transfer switch 250 is on the same side/plate of the first capacitor Cs 201 as the first input switch 210; the second transfer switch 250 is also on the same side/plate of the second capacitor Cs 202 as the second input switch 212.

Third capacitor Cs 203 is between third input switch 214 for coupling the second one of complementary analog input signals (Vin−) to the third capacitor Cs 203 and a second one of complementary output nodes of the PSWC circuit (Vout+). In other words, Vin− is on one side/plate of third capacitor Cs 203, Vout+ is on the other side/plate of third capacitor Cs 203. Fourth capacitor Cs 204 is between fourth input switch 216 for coupling the first one of the complementary analog input signals (Vin+) to the fourth capacitor Cs 204 and third transfer switch 256 for coupling the fourth capacitor Cs 207 to a second one of complementary outputs of the DAC (Vdac−). In other words, Vin+ is on one side/plate of fourth capacitor Cs 204, Vdac+ is on the other side/plate of fourth capacitor Cs 204. Fourth transfer switch 252 is between third capacitor Cs 203 and fourth capacitor Cs 204, and closing the fourth transfer switch 252 can sum charges captured or sampled on the third capacitor Cs 203 and fourth capacitor Cs 204. The fourth transfer switch 252 is on the same side/plate of the third capacitor Cs 203 as the third input switch 214; the fourth transfer switch 252 is also on the same side/plate of the fourth capacitor Cs 204 as the fourth input switch 216.

One aspect of the PSWC circuit is that the PSWC circuit performs bottom plate sampling. In bottom plate sampling, an input is coupled to a top plate of a sampling capacitor via an input switch, and on the other plate of the sampling capacitor (i.e., the bottom plate of the sampling capacitor) is another switch called a bottom plate sampling switch. The bottom plate sampling switch can couple the bottom plate to a fixed voltage (e.g., Ground, or one of the voltage rails or power supplies), and the bottom plate sampling switch opens before the input switch is opened. Purpose of bottom plate sampling is to reduce input dependent charge from being injected to the sampling capacitor when the input switch opens.

For the PSWC circuit illustrated in FIG. 2, the input switches and bottom plate sampling switches are positioned to decouple different common modes which may be present in the circuit. As seen in FIG. 2, the first input switch 210 and the second input switch 212 and the second transfer switch 250 are coupled to first plates (top plates) of the first capacitor Cs 201 and second capacitor Cs 202. The first output node Vout− is coupled to a second plate (bottom plate) of the first capacitor Cs 201. The first transfer switch 254 is coupled to a second plate (bottom) of the second capacitor Cs 202. The third input switch 214 and the fourth input switch 216 and the fourth transfer switch 252 are coupled to first plates (top plates) of the third capacitor Cs 203 and fourth capacitor Cs 204. The second output node Vout+ is coupled to a second plate (bottom plate) of the third capacitor Cs 203. The third transfer switch 256 is coupled to a second plate (bottom) of the fourth capacitor Cs 204. First bottom plate sampling switches 230, 232, and 234 are positioned between the first capacitor Cs 201 and first output node Vout+ of the PSWC circuit and between the third capacitor Cs 203 and the second output node Vout+ of the PSWC circuit. The first bottom plate sampling switches 230, 232, and 234 can connect the bottom plates of first capacitor Cs 201 and third capacitor Cs 203 to input common mode reference for the output buffers. Second bottom plate sampling switches 236, 238, and 240 are positioned between the second capacitor Cs 202 and the first transfer switch 254 and between the fourth capacitor Cs 204 and the third transfer switch 256. The second bottom plate sampling switches 236, 238, and 240 can connect the bottom plates of second capacitor Cs 202 and fourth capacitor Cs 204 to common mode reference of DAC 106.

Timing of Switches for Operating the PSWC

Figure 3:
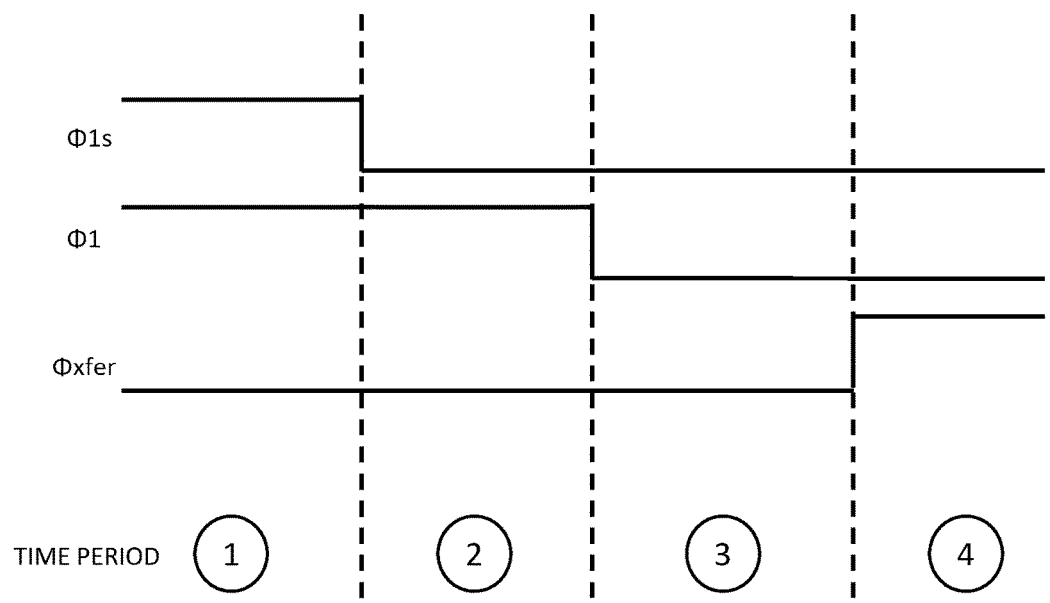
FIG. 3 shows a timing diagram illustrating the different phases of operation for the exemplary PSWC circuit of FIG. 2, according to some embodiments of the disclosure.

FIG. 3 shows a timing diagram illustrating the different phases of operation for the exemplary PSWC circuit of FIG. 2, according to some embodiments of the disclosure. There are three control signals, ϕ1s, ϕ1, and ϕxfer. These control signals are shown next to corresponding switches. The control signals have different timing for operating the PSWC circuit of FIG. 2. During time period 1, input switches and bottom plate switches are closed (as indicated by logical "high" for ϕ1s, and ϕ1). Transfer switches are open (as indicated by logical "low" for ϕxfer). To implement bottom plate sampling, during time period 2, bottom plate switches open (as indicated by logical "low" for ϕ1s). Input switches remain closed (as indicated by logical "high" for ϕ1). During time period 3, input switches open as well (as indicated by logical "low" for ϕ1) to complete sampling or charge acquisition. During time period 4, transfer switches are closed (as indicated by logical "high" for ϕxfer) to implement charge transfer (subtraction and gain is implemented during charge transfer).

Cascading MDAC Functions and Advantages of Decoupled Common Modes

As discussed previously, PSWC circuit can implement subtraction (e.g., Vin−Vin' of FIG. 1) and gain (e.g., 2× gain on Vin−Vin' of FIG. 1) of signals, which are functions found in an MDAC. The PSWC circuit receives complementary analog input signals Vin+ and Vin− which may be provided by input buffers 242. The PSWC circuit also receives complementary DAC output signals Vdac+ and Vdac−, which are representative of Vin' from FIG. 1. Based on Vin and Vin', the PSWC circuit outputs complementary signals at complementary output nodes Vout− and Vout+, which are representative of an amplified residue from FIG. 1. The DAC 106 seen in the FIGURES generates (complementary) signals on the complementary outputs Vdac+ and Vdac− based on a digitized version of the complementary analog input signals (e.g., digital output from ADC 104 of FIG. 1). The signals on the complementary outputs of the DAC 106 is thus is a reconstructed analog input signal (Vin' of FIG. 1). After performing subtraction and gain, signals at the complementary output nodes of the PSWC circuit Vout− and Vout+ represent an amplified residue signal of an MDAC. The signals at the complementary output nodes of the PSWC circuit Vout− and Vout+ may be provided to output buffers 244.

Figure 4:
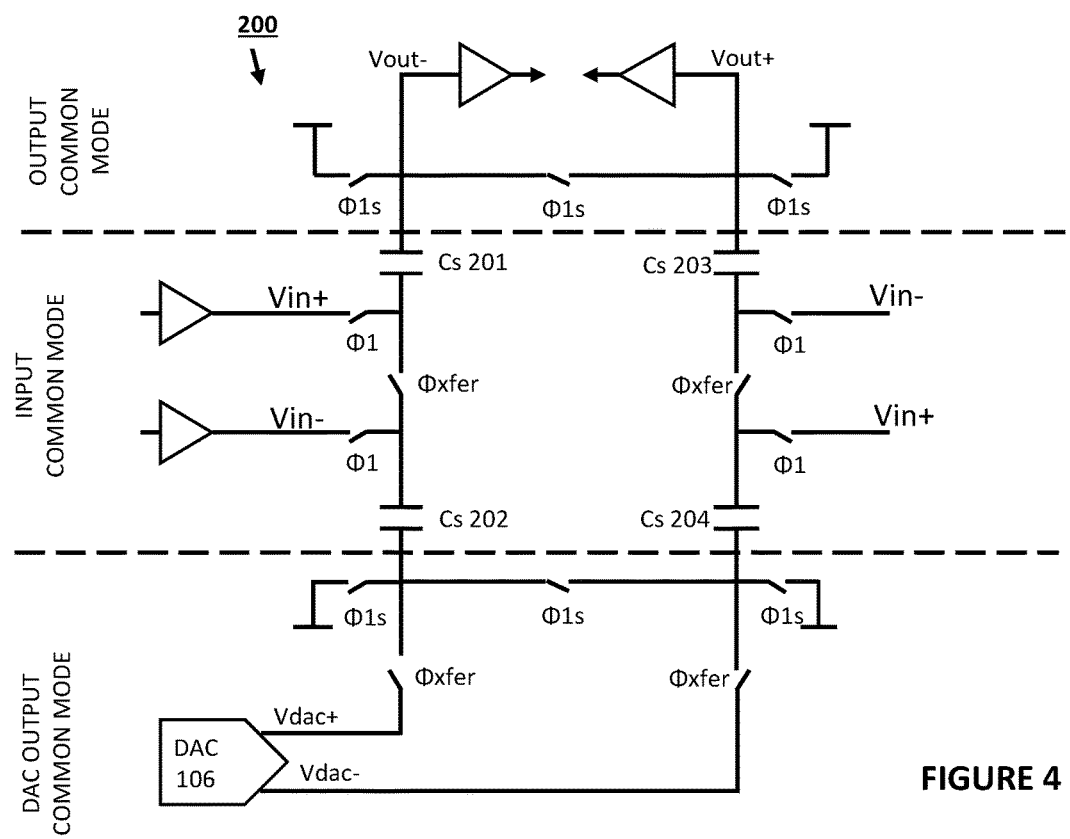
FIG. 4 illustrates the decoupling of common modes of the exemplary PSWC circuit of FIG. 2, according to some embodiments of the disclosure.

MDAC functions implemented using the PSWC circuit illustrated in FIG. 2 are cascaded in stages of a pipelined ADCs. One output of an MDAC is fed as input to another MDAC in a following stage. In other words, signal received from input buffers of a PSWC circuit may have been generated from another PSWC circuit's output buffers 244 (of a previous stage in a pipelined ADC). Signals generated by output buffers may be provided to another input buffer of another PSWC circuit (of a following stage in a pipelined ADC). One benefit to the PSWC circuit illustrated by FIG. 4 is the ability to decouple common modes in the circuit so that no requirements are imposed to require input and output common modes to be compatible with each other. As a result, it is much easier to implement and design cascaded MDAC circuits. If the input and output common modes are not compatible, cascading MDAC functions would require a level shifter in between MDAC circuits in order for the next buffer to remain linear. A number of issues arise when adding a level shifter, including increase in noise, decrease in gain, increase in distortions, and increase in complexity.

FIG. 4 illustrates the decoupling of common modes of the exemplary PSWC circuit of FIG. 2, according to some embodiments of the disclosure. The topology of the PSWC circuit of FIG. 2 allows the circuit to have three different common modes: DAC common mode, input common mode, and output common mode (illustrated by the divisions of common mode domains in FIG. 4). It can be seen that the first capacitor Cs 201 and second capacitor Cs 202 (and the third capacitor Cs 203 and fourth capacitor Cs 204) decouple common mode of the complementary analog input signals (common mode of Vin+ and Vin− from input buffers) from common mode of the complementary outputs of the DAC (common mode of Vdac+ and Vdac− from DAC 106). First capacitor Cs 201 and second capacitor Cs 202 (and the third capacitor Cs 203 and fourth capacitor Cs 204) decouple common mode of the complementary analog input signals (common mode of Vin+ and Vin− from input buffers) from common mode of the complementary output nodes of the PSWC circuit (Vout− and Vout+ for output buffers). Phrased differently, the capacitors and switches of the PSWC are uniquely positioned between the three common mode domains, and thus provides isolation between the three common mode domains. Effectively, the input common mode can be independent from the common modes of the DAC 106 and the output buffers 244 of FIG. 2.

When cascading MDAC functions, the complementary output nodes of the PSWC circuit Vout− and Vout+ are coupled to an output buffer (or output buffers 244 of FIG. 2) for providing complementary output signals of the PSWC circuit as inputs to a following stage in a pipeline ADC. With the decoupling of common modes, the complementary output signals Vout− and Vout+ can be provided to the following stage in the pipelined ADC without a level shifter. The complementary analog input signals (Vin+ and Vin−) are provided by an input buffer (or input buffers 242 of FIG. 2) receiving complementary output signals from a previous stage in a pipelined ADC (the Vout− and Vout+ of a previous stage). With the decoupling of common modes, the complementary analog input signals (Vin+ and Vin−) are provided from the previous stage in the pipelined ADC without a level shifter.

Applying the Improved PSWC Circuit in an MDAC

An MDAC can be implemented in a stage in a pipelined ADC, such as a stage illustrated in FIG. 1. The MDAC can generating an amplified residue signal to be fed to a following stage in the pipelined ADC. The MDAC can also receive an amplified residue signal generated by a previous stage in the pipelined ADC. References are made with respect to FIG. 2 for illustration.

The MDAC includes a DAC (e.g., DAC 106), which receives a quantized version of an analog input signal to the stage (e.g., generated by a coarse ADC) and generates an (analog) output (e.g., complementary outputs Vdac+ and Vdac−). The MDAC also includes sampling capacitors (e.g., Cs 201, Cs 202, Cs 203, Cs 204) for sampling the analog input signal (e.g., complementary Vin+ and Vin−). The sampling capacitors are stacked to implement gain.

The MDAC also includes a first set of bottom plate sampling switches (e.g., switches 236, 238, and 240) for first ones of sampling capacitors (e.g., Cs 202 and Cs 204) positioned at nodes for receiving the output from the DAC (e.g., DAC 106), and a second set of bottom plate sampling switches (e.g., switches 230, 232, and 234) for second ones of sampling capacitors (e.g., Cs 201, Cs, 203) positioned at an input of an output buffer (e.g., output buffer 244) which provides the amplified residue signal to the following stage.

With bottom plate sampling, the input switches are positioned at the top plates of the sampling capacitors. The MDAC can further include input switches (e.g., input switches 210, 212, 214, and 216) positioned at top plates of the sampling capacitors (e.g., Cs 201, Cs 202, Cs 203, and Cs 204) for receiving the analog input signal (e.g., Vin+ and Vin−). The input switches implements sampling of complementary analog input signals onto the sampling capacitors. These input switches can be bootstrapped input switches, whose control terminals may be bootstrapped to the analog input. Bootstrapped input switches may improve performance for high speed input signals with less distortions.

The MDAC can further include first transfer switches (e.g., transfer switches 250 and 252) for shorting pairs of top plates of the sampling capacitors, and second transfer switches (e.g., transfer switches 254 and 256) for coupling the output of the DAC (e.g., DAC 106) to bottom plates of the second ones of the sampling capacitors (e.g., Cs 202, and Cs 204). These transfer switches implements subtraction and gain of the MDAC circuit.

Achieving Lower Noise and Lower Voltage Full Scale

Figure 5:
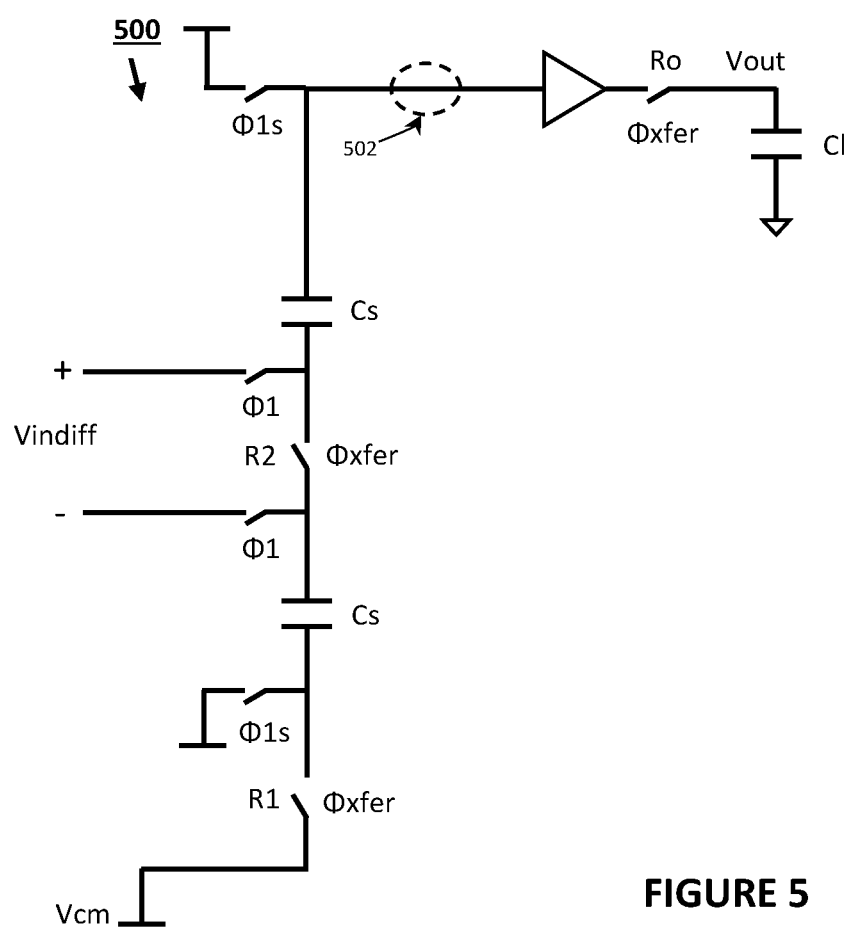
FIG. 5 shows a noise analysis model of the exemplary PSWC circuit of FIG. 2, according to some embodiments of the disclosure.

FIG. 5 shows a noise analysis model 500 of the exemplary PSWC circuit of FIG. 2, according to some embodiments of the disclosure. Vin+ and Vin− has a difference represented by Vindiff. If the DAC (e.g., DAC 106) output is 0, the output nodes of the DAC goes to the common of the analog input Vcm. The noise analysis assume ideal components with no parasitics and noiseless Ro for simplicity. With those assumptions the CP signal gain Avcp=2×. For PSWC circuit illustrated by FIG. 2, the output referred noise is:

$$Vor^2 = kT * \left[ \frac{2}{Cs} + \frac{1}{Cl} * \frac{R1 + R2}{Ro} \right] \qquad (1)$$

Note that noise in both the sample/acquire and transfer phase is reduced for the topology of PSWC circuit illustrated by FIG. 2. If a level shifter inserted (at location 502), additional noise from series capacitance and resistance from switching in the level shifter would be added to the above output referred noise. For the PSWC circuit illustrated by FIG. 2 without having a level shifter, the Avcp can be higher since a level shifter would attenuate the signal due to the additional series capacitance.

Reducing thermal noise and improving gain directly impacts required full scale range in a converter, such a pipelined converter. For a given root mean squared (RMS) input referred noise RMS_in_noise and a desired signal to noise ratio (SNR), the minimum full scale input level VFSdpp (minimum voltage full scale to achieve the SNR given the RMS_in_noise) can be given by:

$$VFSdpp = 2 * \sqrt{2} * 10^{\frac{SNR}{20}} * RMS\_in\_noise \qquad (2)$$

In other words, to achieve a certain level of SNR, tradeoffs are made with the size of the signal (to meet the minimum voltage full scale level VFSdpp) and thermal noise of the circuit. If the converter needs to operate at higher speeds, the designer may limit the size of the capacitors to some value to reduce the size of the capacitive load. If the converter does not meet signal to thermal noise ratio, the designer may have to increase the signal amplitude. Without requiring a level shifter when cascading MDAC functions, it is possible to apply a smaller signal and still achieve the same or higher SNR. Some pipelined ADCs use active charge amplifiers in the MDACs (not charge pump gain amplifier) require a VFSdpp ranging from 1.4 to 1.8V. Depending on the application, noise performance of the charge pump based MDAC (such as the one illustrated in FIG. 2) may be low enough to significantly reduce full scale. Phrased differently, VFSdpp can be reduced while achieving the same SNR. Lowering VFSdpp benefits the entire signal chain including, e.g., an external amplifier and on chip buffer.

Method for Implementing Subtraction and Gain

Figure 6:
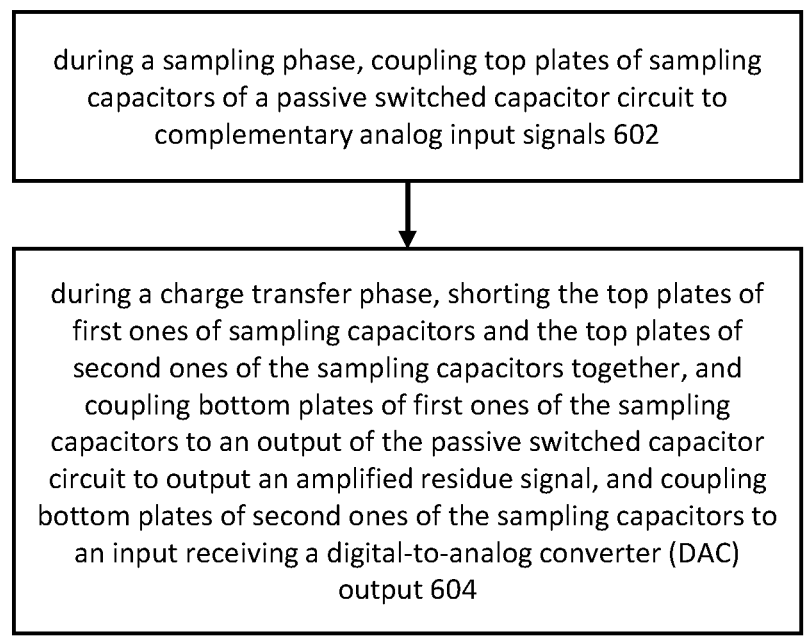
FIG. 6 shows a flow diagram of an exemplary method for implementing subtraction and gain of signals, according to some embodiments of the disclosure.

FIG. 6 shows a flow diagram of an exemplary method for implementing subtraction and gain of signals, according to some embodiments of the disclosure. References are made with respect to FIG. 2 for illustration. In 602, during a sampling phase, top plates of sampling capacitors (e.g., Cs 201, Cs 202, Cs 203, Cs 204) of a PSWC circuit are coupled to complementary analog input signals (e.g., Vin+ and Vin−). Input switches (e.g., first input switch 210, second input switch 212, third input switch 214, and fourth input switch 216) can be closed to couple the top plates to the complementary analog input signals.

In 604, during a charge transfer phase, pairs of top plates of sampling capacitors are shorted together (e.g., top plates of Cs 201 and Cs 202 are shorted together, top plates of Cs 203, and Cs 204 are shorted together). Shorting of the top plates can be implemented by closing transfer switches 250 and 252. Shorting of the top plates stacks the sampling capacitors to combine the charges. According to some embodiments, shorting the top plates of the sampling capacitors sums charges in the sampling capacitors (e.g., sums charges in Cs 201 and Cs 202, and sums charges in Cs 203 and Cs 204) to implement gain.

Further in 604, during a charge transfer phase, bottom plates of first ones of the sampling capacitors (e.g., Cs 201 and Cs 203) are coupled to an output of the PSWC circuit (e.g., Vout− and Vout+) to output an amplified residue signal, bottom plates of second ones of the sampling capacitors (e.g., Cs 202, and Cs 204) are coupled to an input receiving a DAC output (e.g. Vdac+ and Vdac−), e.g., using transfer switches 254 and 256. Effectively, coupling the bottom plates to the output of the PSWC circuit and output of the DAC implements subtraction of the complementary analog input signals (represented by charge captured on the sampling capacitors) and the DAC output.

Through subtraction and gain implemented by the PSWC circuit, the output signal of the PSWC circuit, i.e., the amplified residue signal (e.g., Vout− and Vout+), represents an amplified difference between the complementary analog input signals and the DAC output. The amplified residue signal can be provided as an input to a (following) stage in a pipelined ADC.

During the sampling phase, bottom plate sampling switches at bottom plates of the sampling capacitors (e.g., first bottom plate sampling switches 230, 232, and 234, and second bottom plate sampling switches 236, 238, and 240) prior to opening input switches (e.g., first input switch 210, second input switch 212, third input switch 214, and fourth input switch 216) at the top plates of the sampling capacitors to perform bottom plate sampling of the complementary analog input signals (e.g., Vin+ and Vin−).

EXAMPLES

Example 1 is a passive switched capacitor (PSWC) circuit for implementing subtraction and gain of signals, said circuit comprising: a first capacitor between a first input switch for coupling a first one of complementary analog input signals to the first capacitor and a first one of complementary output nodes of the PSWC circuit; a second capacitor between a second input switch for coupling a second one of the complementary analog input signals to the second capacitor and a first transfer switch for coupling the second capacitor to a first one of complementary outputs of a digital-to-analog converter (DAC); and a second transfer switch for summing charges on the first and second capacitors.

In Example 2, the PSWC circuit of Example 1, can optionally include: a third capacitor between a third input switch for coupling the second one of the complementary analog input signals to the third capacitor and a second one of the complementary output nodes of the PSWC circuit; a fourth capacitor between a fourth input switch for coupling the first one of the complementary analog input signals to the fourth capacitor and a third transfer switch for coupling the fourth capacitor to a second one of the complementary outputs of the DAC; and a fourth transfer switch for summing charges on the third and fourth capacitors.

In Example 3, the PSWC circuit of Example 1 or 2 can optionally include: the complementary output nodes of the PSWC circuit being coupled to an output buffer for providing complementary output signals of the PSWC circuit as inputs to a following stage in a pipeline analog-to-digital converter.

In Example 4, the PSWC circuit of Example 3 can optionally include: the complementary output signals being provided to the following stage in the pipelined analog-to-digital converter without a level shifter.

In Example 5, the PSWC circuit of any one of Examples 1-4 can optionally include: the complementary analog input signals being provided by an input buffer receiving complementary output signals from a previous stage in a pipelined analog-to-digital converter.

In Example 6, the PSWC circuit of Example 5 can optionally include the complementary analog input signals being provided from the previous stage in the pipelined analog-to-digital converter without a level shifter.

In Example 7, the PSWC circuit of any one of Examples 1-6 can optionally include: the DAC generating signals on the complementary outputs of the DAC based on a digitized version of the complementary analog input signals.

In Example 8, the PSWC circuit of any one of Examples 1-7 can optionally include: the first and second input switches and the second transfer switch being coupled to first plates of the first and second capacitors; the first one of complementary output nodes is coupled to a second plate of the first capacitor; and the first transfer switch is coupled to a second plate of the second capacitor.

In Example 9, the PSWC circuit of any one of Examples 1-8 can optionally include: first bottom plate sampling switches between the first capacitor and first output node of the PSWC circuit; and second bottom plate sampling switches between the second capacitor and the first transfer switch.

In Example 10, the PSWC circuit of any one of Examples 1-9 can optionally include: the first and second capacitors decoupling common mode of the complementary analog input signals from common mode of the complementary outputs of the DAC.

In Example 11, the PSWC circuit of any one of Examples 1-10 can optionally include: the first and second capacitors decoupling common mode of the complementary analog input signals from common mode of the complementary output nodes of the PSWC circuit.

Example 12 is a method for implementing subtraction and gain of signals, the method comprising: during a sampling phase, coupling top plates of sampling capacitors of a passive switched capacitor circuit to complementary analog input signals; and during a charge transfer phase, shorting pairs of top plates of the sampling capacitors, and coupling bottom plates of first ones of the sampling capacitors to an output of the passive switched capacitor circuit to output an amplified residue signal, and coupling bottom plates of second ones of the sampling capacitors to an input receiving a digital-to-analog converter (DAC) output.

In Example 13, the method of Example 12 can optionally include: during the sampling phase, opening bottom plate sampling switches at bottom plates of the sampling capacitors prior to opening input switches at the top plates of the sampling capacitors to perform bottom plate sampling of the complementary analog input signals.

In Example 14, the method of Example 12 or 13 can optionally include shorting the top plates of the sampling capacitors sums charges in the sampling capacitors to implement gain.

In Example 15, the method of any one of Examples 12-14 can optionally include coupling the bottom plates of the first ones of the sampling capacitors to the output of the passive switched capacitor circuit, and coupling the bottom plates of the second ones of the sampling capacitors to the input receiving the DAC output implements subtraction of the complementary analog input signals and the DAC output.

In Example 16, the method of any one of Examples 12-15 can optionally include the amplified residue signal representing an amplified difference between the complementary analog input signals and the DAC output.

In Example 17, the method of any one of Examples 12-16 can optionally include providing the amplified residue signal as an input to a stage in a pipelined analog-to-digital converter.

Example 18 is a gain stage in an analog-to-digital converter (ADC) for generating an amplified signal for a further circuit, the gain stage comprising: sampling capacitors for sampling an analog input signal to the gain stage, wherein the sampling capacitors are stacked to implement gain; a first set of bottom plate sampling switches for first ones of sampling capacitors positioned at nodes for receiving a voltage; and a second set of bottom plate sampling switches for second ones of sampling capacitors positioned at an input of an output buffer which provides the amplified signal to the further circuit.

In Example 19, the gain stage of Example 18 can optionally include input switches positioned at top plates of the sampling capacitors for receiving the analog input signal.

In Example 20, the gain stage of Example 18 or 19 can optionally include: first transfer switches for shorting pairs of top plates of the sampling capacitors; and second transfer switches for coupling the voltage to bottom plates of the second ones of the sampling capacitors.

Example 21 is a multiplying digital-to-analog converter (MDAC) in a stage in a pipelined analog-to-digital converter (ADC) for generating an amplified residue signal to be fed to a following stage in the pipelined ADC, the MDAC comprising: a digital-to-analog converter (DAC) receiving a quantized version of an analog input signal to the stage and generating an output; sampling capacitors for sampling the analog input signal, wherein the sampling capacitors are stacked to implement gain; a first set of bottom plate sampling switches for first ones of sampling capacitors positioned at nodes for receiving the output from the DAC; and a second set of bottom plate sampling switches for second ones of sampling capacitors positioned at an input of an output buffer which provides the amplified residue signal to the following stage.

In Example 22, the gain stage of Example 21 can optionally include input switches positioned at top plates of the sampling capacitors for receiving the analog input signal.

In Example 23, the gain stage of Example 21 or 22 can optionally include: first transfer switches for shorting pairs of top plates of the sampling capacitors; and second transfer switches for coupling the output from the DAC to bottom plates of the second ones of the sampling capacitors.

Example 24 is an apparatus comprising means for implementing and/or carrying out any one of the methods in Examples 12-17.

Variations and Implementations

Figure 7:
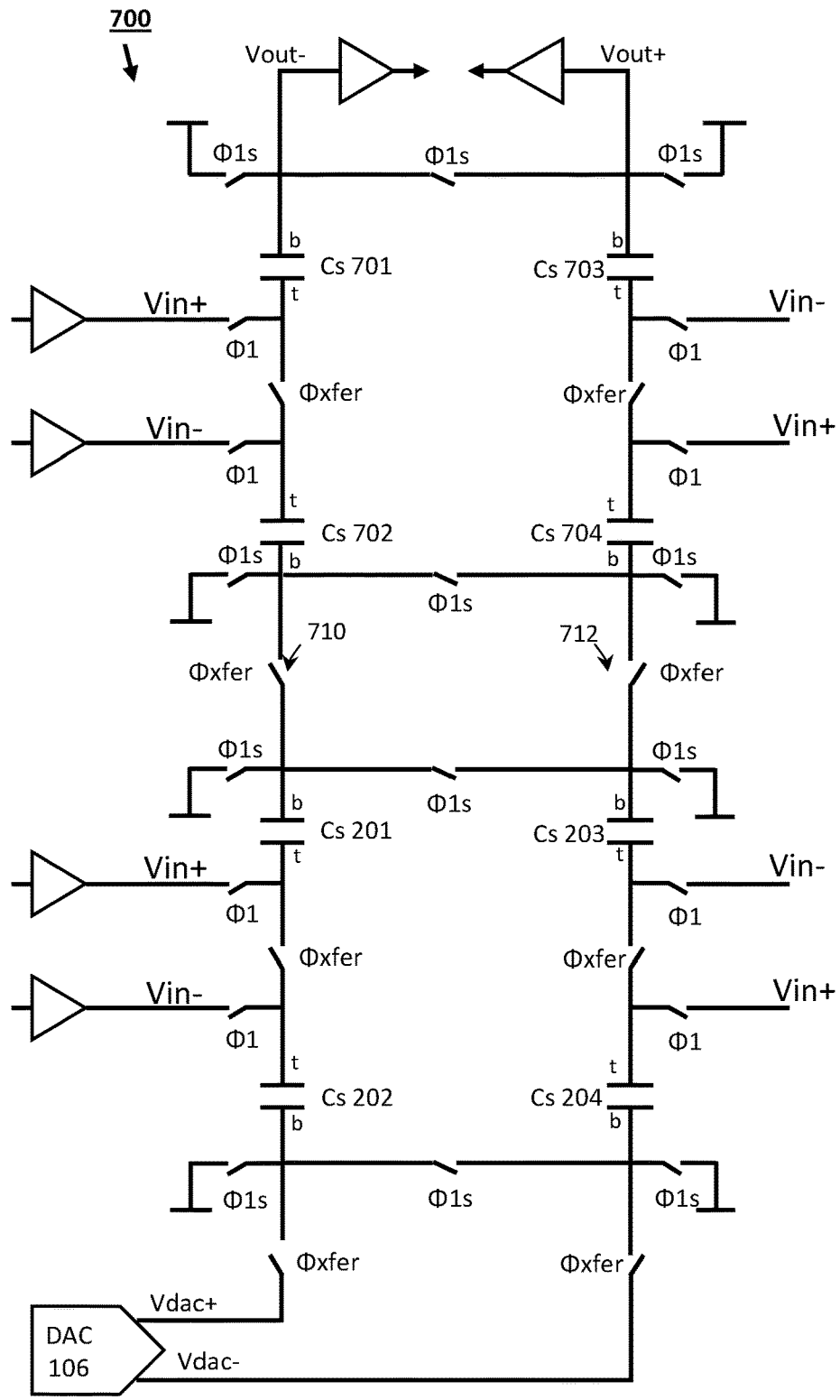
FIG. 7 shows an exemplary PSWC circuit used in an MDAC with 4× gain, according to some embodiments of the disclosure.

While the examples in FIGURES show a 2× gain PSWC circuit, it is envisioned that other gain multipliers can be implemented. FIG. 7 shows an exemplary PSWC circuit used in an MDAC with 4× gain, according to some embodiments of the disclosure. To provide additional (passive) gain, the PSWC circuit 700 adds additional sampling capacitors Cs 701, Cs 702, Cs 703, and Cs 704 and transfer switches 710 and 712 to PSWC circuit 200 of FIG. 2. The 4× gain comes from the four sampling capacitors Cs 202, Cs 201, Cs 702, and Cs 701 being stacked and the four capacitors Cs 204, Cs 203, Cs 704, and Cs 703 being stacked during the charge transfer phase (when the switches φxfer are closed). In a similar fashion as FIG. 2, an input switch couples to the top plate of Cs 701, and an output node is at the bottom plate of Cs 701. The bottom plate sampling switch is at the bottom plate of Cs 701. Configuration for sampling capacitor Cs 703 is similar to Cs 701. Another input switch couples to the top plate of Cs 702, and a fixed voltage (e.g., Ground, or zero Volts) can be coupled to the bottom plate of Cs 702. Configuration for sampling capacitor Cs 704 is similar to Cs 702. The PSWC circuit 700 has similar benefits as the embodiments shown in FIGS. 2, 4, and 5. In some embodiments, transfer switches 710, 712 can be omitted and only one set of bottom plate sampling switches (controlled by φ1) would be needed for the sampling capacitors C2 702, Cs 201, Cs 704, and Cs 203.

Figure 8:
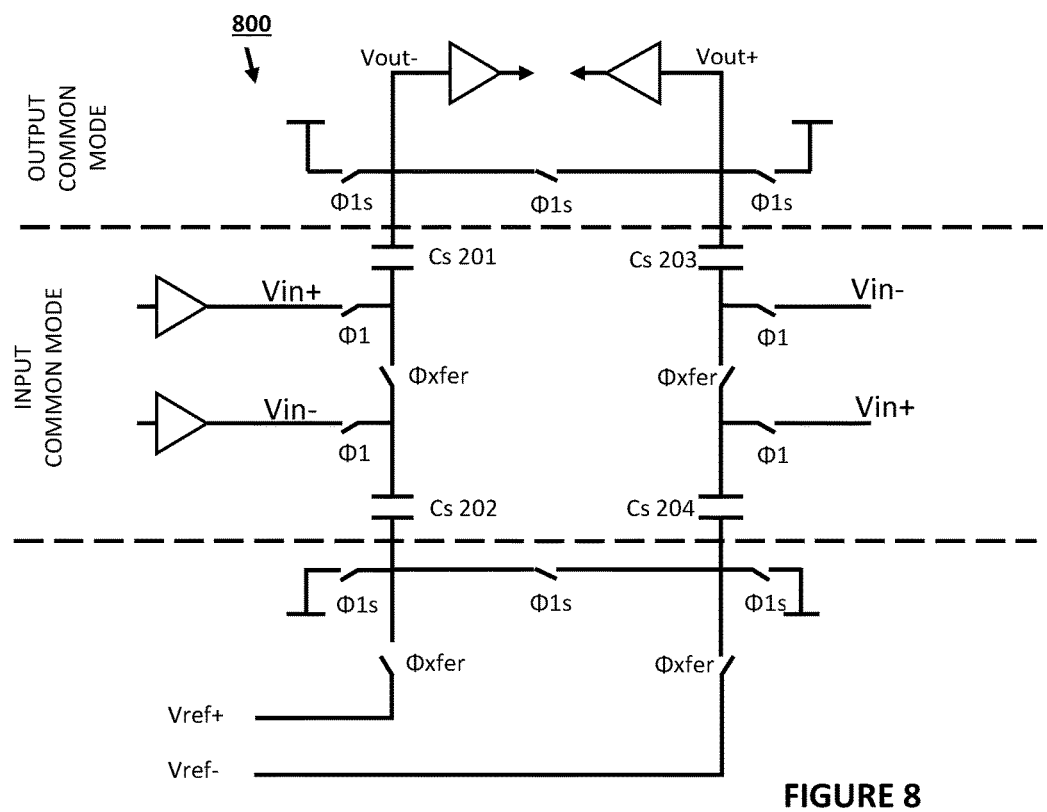
FIG. 8 shows an exemplary gain stage, according to some embodiments of the disclosure.

While many examples herein describes a PSWC circuit that can implement gain and subtraction, it is envisioned that the PSWC circuit can be used in a gain stage (without subtraction) as well. For instance, some ADCs include a gain stage in front of a further circuit. By amplifying the signal via the gain stage, the noise performance of the further circuit can be improved when a larger input signal is used. Phrased differently, amplifying the input signal with a gain stage can attenuate (or made less significant) non-idealities, mismatches, or flaws of the further circuit processing the amplified signal. As a result, effective SNR can be increased. Exemplary further circuits receiving such amplified signal from a gain stage can include a flash/coarse ADC, a quantizer, or a comparator. These further circuits can be found in pipeline ADCs, successive-approximation-register ADCs, delta-sigma modulators, etc. FIG. 8 shows an exemplary gain stage, according to some embodiments of the disclosure. Instead of providing a DAC (seen in FIG. 2), the DAC is replaced by a voltage, such as a fixed reference voltage Vref+ and Vref−. In an example, both Vref+ and Vref− are both Ground or zero Volts (as opposed to Vdac+ and Vdac− which represents a variable voltage). The resulting circuit 800 still benefits from the decoupling of common modes between the input common mode and the output common mode. As a result, cascading of said gain stages can implemented easily without level shifters or without complicated level shifters, thus greatly relaxing the analog circuit design and can improve noise performance.

Note that particular embodiments of the present disclosure may be readily included in a system on chip (SOC) package, either in part, or in whole. An SOC represents an Integrated Circuit (IC) that integrates components of a computer or other electronic system into a single chip. It may contain digital, analog, mixed-signal, and converter functions (or some other desired functions): all of which may be provided on a single chip substrate. Other embodiments may include a multi-chip-module (MCM), with a plurality of separate ICs located within a single electronic package and configured to interact closely with each other through the electronic package.

In certain contexts, the features discussed herein can be applicable to converters being used in many different applications. Various exemplary applications include medical systems, scientific instrumentation, transportation systems, aerospace systems, wireless and wired communications, radar, industrial process control, audio and video equipment, consumer devices, and other converter-based systems.

In the discussions of the embodiments above, the capacitors, clocks, resistors, switches, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, the circuits described herein may be provided on a board of an associated electronic device. The board can be a general circuit board that can hold various components of the internal electronic system of the electronic device and, further, provide connectors for other peripherals. For instance, the circuits described herein can communicate with the components of the associated electronic device (e.g., signal generators, processors, memory, transmitters, receivers, etc.). More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the described functions, illustrate only some of the possible functions that may be executed by, or within, circuits and systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A passive switched capacitor (PSWC) circuit for implementing subtraction and gain of signals, said circuit comprising:
a first capacitor between a first input switch for coupling a first one of complementary analog input signals to the first capacitor and a first one of complementary output nodes of the PSWC circuit;
a second capacitor between a second input switch for coupling a second one of the complementary analog input signals to the second capacitor and a first transfer switch for coupling the second capacitor to a first one of complementary outputs of a digital-to-analog converter (DAC); and
a second transfer switch for summing charges on the first and second capacitors.

2. The PSWC circuit of claim 1, further comprising:
a third capacitor between a third input switch for coupling the second one of the complementary analog input signals to the third capacitor and a second one of the complementary output nodes of the PSWC circuit;
a fourth capacitor between a fourth input switch for coupling the first one of the complementary analog input signals to the fourth capacitor and a third transfer switch for coupling the fourth capacitor to a second one of the complementary outputs of the DAC; and a fourth transfer switch for summing charges on the third and fourth capacitors.

3. The PSWC circuit of claim 1, wherein the complementary output nodes of the PSWC circuit are coupled to an output buffer for providing complementary output signals of the PSWC circuit as inputs to a following stage in a pipeline analog-to-digital converter.

4. The PSWC circuit of claim 3, wherein the complementary output signals are provided to the following stage in the pipelined analog-to-digital converter without a level shifter.

5. The PSWC circuit of claim 1, wherein the complementary analog input signals are provided by an input buffer receiving complementary output signals from a previous stage in a pipelined analog-to-digital converter.

6. The PSWC circuit of claim 5, wherein the complementary analog input signals are provided from the previous stage in the pipelined analog-to-digital converter without a level shifter.

7. The PSWC circuit of claim 1, wherein the DAC generates signals on the complementary outputs of the DAC based on a digitized version of the complementary analog input signals.

8. The PSWC circuit of claim 1, wherein:

the first and second input switches and the second transfer switch are coupled to first plates of the first and second capacitors;

the first one of complementary output nodes is coupled to a second plate of the first capacitor; and the first transfer switch is coupled to a second plate of the second capacitor.

9. The PSWC circuit of claim 1, further comprising:

first bottom plate sampling switches between the first capacitor and first output node of the PSWC circuit; and second bottom plate sampling switches between the second capacitor and the first transfer switch.

10. The PSWC circuit of claim 1, wherein the first and second capacitors decouple common mode of the complementary analog input signals from common mode of the complementary outputs of the DAC.

11. The PSWC circuit of claim 1, wherein the first and second capacitors decouple common mode of the complementary analog input signals from common mode of the complementary output nodes of the PSWC circuit.

12. A method for implementing subtraction and gain of signals, the method comprising:

during a sampling phase, coupling top plates of sampling capacitors of a passive switched capacitor circuit to complementary analog input signals; and during a charge transfer phase, shorting pairs of top plates of the sampling capacitors, and coupling bottom plates of first ones of the sampling capacitors to an output of the passive switched capacitor circuit to output an amplified residue signal, and coupling bottom plates of second ones of the sampling capacitors to an input receiving a digital-to-analog converter (DAC) output.

13. The method of claim 12, further comprising:

during the sampling phase, opening bottom plate sampling switches at bottom plates of the sampling capacitors prior to opening input switches at the top plates of the sampling capacitors to perform bottom plate sampling of the complementary analog input signals.

14. The method of claim 12, wherein shorting the top plates of the sampling capacitors sums charges in the sampling capacitors to implement gain.

15. The method of claim 12, wherein coupling the bottom plates of the first ones of the sampling capacitors to the output of the passive switched capacitor circuit, and coupling the bottom plates of the second ones of the sampling capacitors to the input receiving the DAC output implement subtraction of the complementary analog input signals and the DAC output.

16. The method of claim 12, wherein the amplified residue signal represents an amplified difference between the complementary analog input signals and the DAC output.

17. The method of claim 12, further comprising:

providing the amplified residue signal as an input to a stage in a pipelined analog-to-digital converter.

18. A gain stage in an analog-to-digital converter (ADC) for generating an amplified signal for a further circuit, the gain stage comprising:

sampling capacitors for sampling an analog input signal to the gain stage, wherein the sampling capacitors are stacked to implement gain;

a first set of bottom plate sampling switches for first ones of sampling capacitors positioned at nodes for receiving a voltage; and a second set of bottom plate sampling switches for second ones of sampling capacitors positioned at an input of an output buffer which provides the amplified signal to the further circuit.

19. The gain stage of claim 18, further comprising:

input switches positioned at top plates of the sampling capacitors for receiving the analog input signal.

20. The gain stage of claim 18, further comprising:

first transfer switches for shorting pairs of top plates of the sampling capacitors; and second transfer switches for coupling the voltage to bottom plates of the second ones of the sampling capacitors.

* * * * *